(12) United States Patent
Park

(10) Patent No.: US 8,013,520 B2
(45) Date of Patent: Sep. 6, 2011

(54) ORGANIC LIGHT EMITTING DISPLAY DEVICE WITH A BEZEL AND RIB AND A SECURE INTERCONNECTION THERE BETWEEN

(75) Inventor: Hong-sik Park, Suwon-si (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 287 days.

(21) Appl. No.: 12/130,849

(22) Filed: May 30, 2008

(65) Prior Publication Data
US 2008/0297041 A1 Dec. 4, 2008

(30) Foreign Application Priority Data
May 30, 2007 (KR) .................. 10-2007-0052727

(51) Int. Cl.
*G02F 1/1333* (2006.01)

(52) U.S. Cl. ........... 313/504; 313/498; 313/512; 349/58

(58) Field of Classification Search .................. None
See application file for complete search history.

(56) References Cited

U.S. PATENT DOCUMENTS

| | | | | |
|---|---|---|---|---|
| 6,593,979 B1* | 7/2003 | Ha et al. | ............................ | 349/58 |
| 2001/0035931 A1* | 11/2001 | Kumagai et al. | ............... | 349/153 |
| 2002/0105605 A1* | 8/2002 | Huang et al. | ..................... | 349/58 |
| 2005/0270800 A1* | 12/2005 | Kim et al. | ....................... | 362/614 |
| 2007/0064378 A1* | 3/2007 | Lo et al. | .......................... | 361/681 |
| 2008/0074036 A1* | 3/2008 | Wang et al. | .................... | 313/504 |
| 2008/0291612 A1 | 11/2008 | Kim et al. | | |

FOREIGN PATENT DOCUMENTS

| | | |
|---|---|---|
| JP | 2002-182209 | 6/2002 |
| JP | 2005-121929 | 5/2005 |
| KR | 1020000041544 | 7/2000 |
| KR | 1020010036079 A | 5/2001 |
| KR | 1020010077361 A | 8/2001 |
| KR | 1020010094205 A | 10/2001 |
| KR | 1020020002985 | 1/2002 |
| KR | 20-0348836 | 4/2004 |
| KR | 100556031 | 2/2006 |
| KR | 1020060060218 A | 6/2006 |
| KR | 1020060101265 | 9/2006 |
| KR | 100645694 | 11/2006 |

OTHER PUBLICATIONS

Notice of Allowance in related Korean Application No. 2008-018063046, dated Mar. 31, 2008.

* cited by examiner

*Primary Examiner* — Anne Hines
*Assistant Examiner* — Tracie Green
(74) *Attorney, Agent, or Firm* — Knobbe, Martens, Olson & Bear, LLP

(57) ABSTRACT

An organic light emitting display device includes an organic light emitting display panel; a bezel including a lower surface and a plurality of side walls extending from edges of the lower surface, and receiving the display panel therein; and a protective window provided on the top of the bezel, wherein the bezel is provided with a first rib, and the protective window is provided with a groove coupled to the first rib.

19 Claims, 6 Drawing Sheets

ORGANIC LIGHT EMITTING DISPLAY DEVICE WITH A BEZEL AND RIB AND A SECURE INTERCONNECTION THERE BETWEEN

CROSS-REFERENCE TO RELATED APPLICATIONS

This application claims the benefit of Korean Patent Application No. 10-2007-0052727, filed on May 30, 2007 in the Korean Intellectual Property Office, the disclosure of which is incorporated herein by reference.

BACKGROUND

1. Technical Field

The present disclosure relates to an organic light emitting display device, and more particularly to an organic light emitting display device including a bezel and a protective window.

2. Discussion of Related Art

Organic light emitting display devices are widely used and have relatively simple structures. An organic light emitting display device, which is also referred to as an organic light emitting element, is a self-light-emitting type of element using an organic layer as an light emitting layer. Since the organic light emitting display device does not require a separate light-emitting back light unlike a liquid crystal display, it has the advantages thinness and light weight. Therefore, organic light emitting display devices have recently been actively developed as display panels for portable information terminals such as mobile computers, portable phones, portable gaming devices, electronic books, and the like.

A typical organic light emitting display device has a structure comprising at least one organic film layer including a light emitting layer interposed between a first electrode and a second electrode. The first electrode is formed on a substrate, and functions as an anode, injecting holes into the organic film layer. On the organic film opposite to the first electrode is formed the second electrode, which functions as a cathode for injecting electrons therein.

A display panel comprising an organic light emitting display device generally uses a glass substrate, which can break when deformed, such as from an external impact. Also, as displays become smaller and thinner, the rigidity of the display panel is reduced, thereby increasing the possibility of deformation and breakage.

SUMMARY OF THE INVENTION

It is an object to provide an organic light emitting display device with improved bonding and adhesion between a bezel and a protective window.

In order to accomplish the objects as described above, according to one aspect, there is provided an organic light emitting display device including: an organic light emitting display panel; a bezel including a lower surface and a plurality of side walls extending from the edges of the lower surface, and receiving the display panel by means of the lower surface and the side walls; and a protective window provided on the top of the bezel, wherein the bezel is provided with a first rib, and the protective window is provided with a groove coupled to the first rib.

Preferably, the first rib is a folded edge or fold-over. The first rib can be bent by bending the side wall. The fold-over can be bent in an opposite direction from the display panel in the bezel. The bezel can further include a second rib extending in an orthogonal direction to the first rib between the side wall and the first rib of the bezel, and the groove formed on an inner side of the protective window corresponding to the first rib. The side wall of the bezel can correspond to three sides of the display panel. An adhesive member can be included between the bezel and the protective window. A polarizing plate can be included between the display panel and the protective window. The bezel may comprise a material selected from the group consisting of stainless steel (STS), magnesium, alloy of magnesium, and aluminum.

Some embodiments comprise an organic light emitting display device comprising: an organic light emitting display panel; a bezel comprising a lower surface and a plurality of side walls extending from edges of the lower surface, the lower surface and the side walls forming a receiving space in which the display panel is received; a first rib formed on at least one side wall; a protective window disposed on the top of the bezel; and a groove formed on the protective window, wherein the first rib is coupled with the groove.

In some embodiments, the first rib comprises a fold-over portion. In some embodiments, the fold-over of the first rib is formed by bending a portion of a side wall. In some embodiments, the fold-over forms an auxiliary side wall. In some embodiments, substantially no space exists between the sidewall and the auxiliary side wall. In some embodiments, the auxiliary sidewall extends to about the lower surface of the bezel. In some embodiments, the fold-over is folded outwardly relative to the receiving space. In some embodiments, the fold-over is folded inwardly relative to the receiving space. In some embodiments, the fold-over comprises a rounded profile.

In some embodiments, the bezel further comprises at least one a second rib disposed between the side wall and the first rib of the bezel and substantially orthogonal thereto. In some embodiments, the second rib is adhered to a projecting part of the protective window.

In some embodiments, the groove is formed on an inner side of the protective window in a position corresponding to the first rib.

In some embodiments, the bezel comprises three side walls, corresponding to three sides of the display panel. In some embodiments, each sidewall comprises a first rib.

In some embodiments, an adhesive member is disposed between the bezel and the protective window. In some embodiments, at least a portion of the adhesive member is disposed in a contact surface between the first rib and the groove. In some embodiments, the adhesive member comprises at least one of an adhesive and a vinyl tape.

In some embodiments, a polarizing plate is disposed between the display panel and the protective window. In some embodiments, the bezel comprises at least one of stainless steel (STS), magnesium, magnesium alloy, and aluminum.

BRIEF DESCRIPTION OF THE DRAWINGS

These and/or other aspects and advantages will become apparent and more readily appreciated from the following description of exemplary embodiments, taken in conjunction with the accompanying drawings of which.

DETAILED DESCRIPTION OF CERTAIN EMBODIMENTS

Hereinafter, certain embodiments will be described in detail with reference to the accompanying drawings.

Deformation and breakage of a display panel are prevented by mounting the display panel in a protective bezel. Also, a protective window for protecting the display panel from external assaults is disposed on the top of the bezel in which the display panel is mounted. The protective window can be formed using any suitable process, for example, a press process, etc., and is generally formed in a shape and size corresponding to the shape and size of the bezel. More specifically, the protective window is bonded top of the bezel to protect the display panel from external forces, as well as to reinforce the mechanical strength of the organic light emitting display device having the display panel received therein. Hereinafter, an embodiment of an organic light emitting display device in which a protective window is bonded to a bezel in which the display panel is received will be described in more detail.

Figure 1:
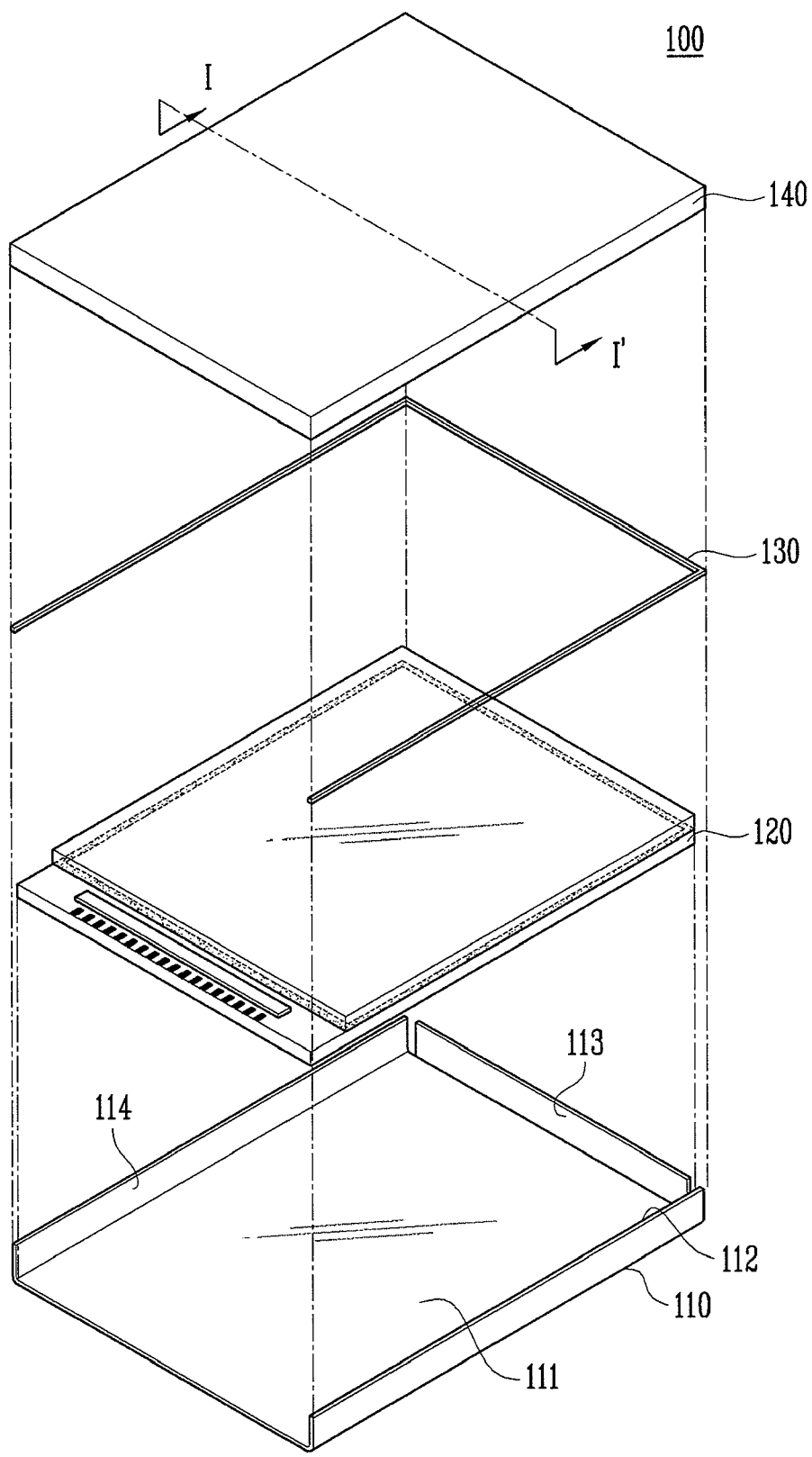
FIG. 1 is an exploded perspective view schematically showing an organic light emitting display device.
Figure 2:
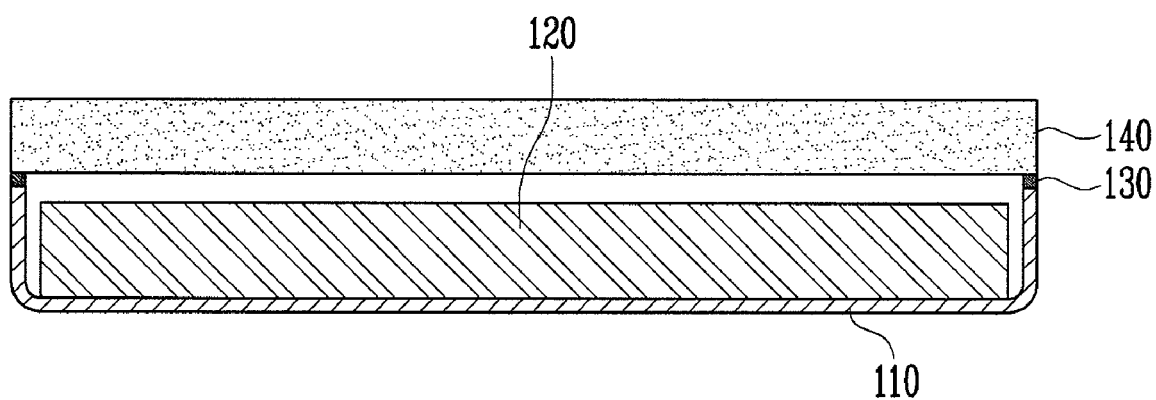
FIG. 2 is a cross-sectional view taken along section I-I' of FIG. 1.

FIG. 1 is an exploded perspective view schematically showing an embodiment of an organic light emitting display device. FIG. 2 is a cross-sectional view taken along section I-I' of FIG. 1. Referring to FIGS. 1 and 2, the organic light emitting display device 100 includes a display panel 120 having a first substrate on which an organic light emitting element is formed, a second substrate disposed over the first substrate, and a seal for bonding the first substrate and the second substrate; and a bezel including a lower surface 111 and a plurality of side walls 112, 113, and 114 extending from edges of the lower surface 111, and allowing the display panel 120 to be received in a space defined by the lower surface 111 and the side walls 112, 113, and 114; and a protective window bonded to the top of the bezel 110.

The display panel 120 includes the first substrate on which the organic light emitting element is formed, the second substrate disposed over the first substrate, and the seal for bonding the first substrate and the second substrate.

The bezel 110 reinforces the strength of the display panel 120. The bezel 110 comprises the lower surface 111 and the plurality of side walls 112, 113, and 114 extending from the edge of the lower surface 111. A receiving space for the display panel 120 is formed by the lower surface 111 and the side walls 112, 113, and 114 of the bezel 110, with the substrate of the display panel 120 corresponding to the lower surface 111 of the bezel 110, and the side walls 112, 113, and 114 corresponding to the sides of the display panel 120.

In the illustrated embodiment, the side walls 112, 113, and 114 of the bezel 110 can be formed by extending the lower surface 111 of the bezel 110 in an orthogonal direction, with locations and dimensions corresponding to sides of the display panel 120 disposed therein. The bezel 110 comprises at least one of stainless steel (STS-Korean Standard), magnesium, magnesium alloy, and aluminum.

In order to bond the protective window 140 to the bezel 110, an adhesive member 130 is formed between the side walls 112, 113, and 114 of the bezel 110 and a joining face of the protective window 140. The adhesive member 130 can be formed of either an adhesive and/or a vinyl tape composed.

However, the contact area of the adhesive member 130 between the bezel 110 and the protective window 140 is narrow so that it is difficult to adequately join the protective window 140 to the bezel 110. Also, the protective window can be easily detached due to deterioration of adhesion in the adhesive member 130 when subjected to external forces.

Figure 3:
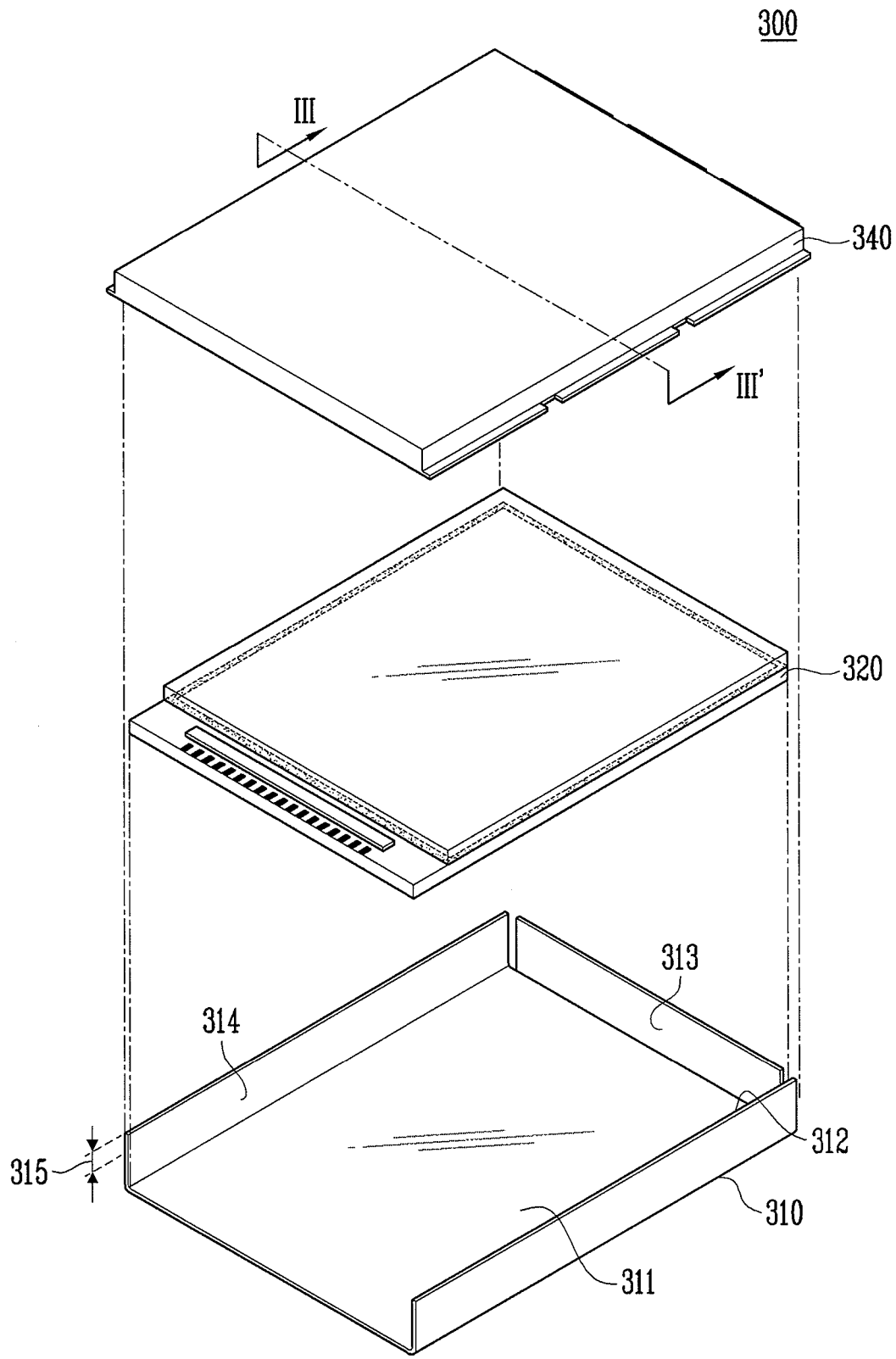
FIG. 3 is an exploded perspective view schematically showing an organic light emitting display device according to one embodiment.
Figure 4:
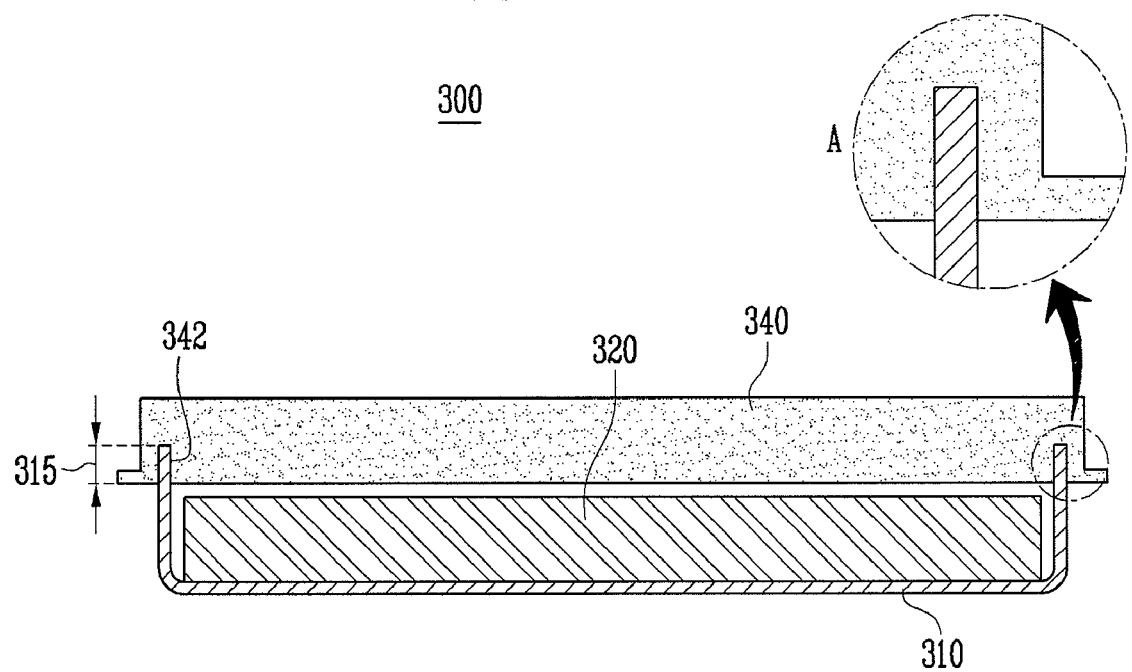
FIG. 4 is a cross-sectional view taken along section III-III' of FIG. 3.

FIG. 3 is an exploded perspective view schematically showing an organic light emitting display device according to an embodiment of the present invention, and FIG. 4 is a cross-sectional view taken along section III-III' of FIG. 3. Referring to FIGS. 3 and 4, an organic light emitting display device 300 includes a display panel 320 having a first substrate on which an organic light emitting element is formed, a second substrate disposed over the first substrate, and a seal for bonding the first substrate and the second substrate; a bezel 310 including a lower surface 311 and a plurality of side walls 312, 313, and 314 extending from edges of the lower surface 311, and allowing the display panel 320 to be received in a space defined thereby. In addition, the display device 300 includes a protective window 340 provided on the top of the bezel 310, and a first rib 315, extending from the side wall of the bezel 310, coupled to a groove 342 formed on the inner side of the protective window 340.

The display panel 320 includes a first substrate on which an organic light emitting element is formed, a second substrate disposed over the first substrate, and a seal sealing the first substrate and the second substrate. Also, the display panel 320 can be equipped with a polarizing plate (not shown) for reducing external light reflections. The polarizing plate is disposed in a space between the display panel 320 and the protective window to reduce movement of the display panel 320.

The first substrate includes a pixel region, where the organic light emitting element is formed, and a non-pixel region. The pixel region is provided with scan lines and data lines, and organic light emitting elements coupled to the scan lines and the data lines in a matrix to form pixels. The non-pixel region is provided with scan lines and data lines extending from scan lines and data lines in the pixel region, a power supply line for operating the organic light emitting elements, and a scan driver and a data driver for processing external signals, supplied through a pad unit, and supplying the signals to the scan lines and the data lines.

The organic light emitting element comprises an anode electrode, a light emitting layer, and a cathode electrode. When a predetermined voltage is applied between the anode electrode and the cathode electrode, holes injected through the anode electrode and electrons injected through the cathode electrode recombine in the light emitting layer, which then emits light.

The pad unit is coupled to a flexible printed circuit (FPC) in a film form, and the power supply voltage, the scan signal, and the data signal can be input through the FPC from an external source.

The second substrate is to protect the organic light emitting element formed on the first substrate from oxygen and moisture. A seal is formed between the first substrate and the second substrate to bond the first substrate and the second substrate and/or form an airtight seal therebetween. In the illustrated embodiment, the seal is formed along the circumference of the organic light emitting element. The seal can use various materials such inorganic sealants and/or organic sealants, etc. Preferably, of the seal comprises an inorganic material.

The bezel 310 reinforces the strength of the display panel 320. The bezel 310 comprises the lower surface 311, the plurality of side walls 312, 313, and 314 extending from edges of the lower surface 311, and the first rib 315 extending from at least one of the plurality of the side walls 312, 313, and 314. The receiving space of the display panel 320 is formed by the lower surface 311 and the side walls 312, 313, and 314 of the bezel 310, with the substrate of the display panel 320 corresponding to the lower surface 311 of the bezel 310, and the side walls of the display panel 320 corresponding to the side walls 312, 313, and 314 of the bezel 310.

In the illustrated embodiment, the side walls 312, 313, and 314 of the bezel 310 extend in an orthogonal direction from the lower surface 311 of the bezel 310, and correspond to the sides of the display panel 320. In addition, the first rib 315 extends in direction parallel to the adjacent side wall of the plurality of the side walls 312, 313, and 314 of the bezel 310. In the illustrated embodiment, a first rib is formed on each of the side walls 312, 313, and 314.

In order to bond the protective window 340 protecting the display panel 320 to the bezel 310, the first rib 315 is inserted into a groove 342 formed on the inner side of the protective window 340, thereby coupling the bezel 310 and the protective window 340 as shown in inset A of FIG. 1.

That is, the first ribs 315 extending from the side walls 312, 313, and 314 of the bezel 310 are coupled to the groove 342 formed in the inner side of the protective window 340 to bond the bezel 310 and the protective window 340.

In addition, in order to improve the bond strength between the bezel 310 and the protective window 340, an adhesive member (not shown) can be further formed on the surface of the first rib 315 that contacts the groove 342.

As such, the first rib 315 of the bezel 310 is coupled to the groove 342 formed in the inner side of the protective window 340, thereby improving the bond strength between the bezel 310 and the protective window 340.

Figure 5:
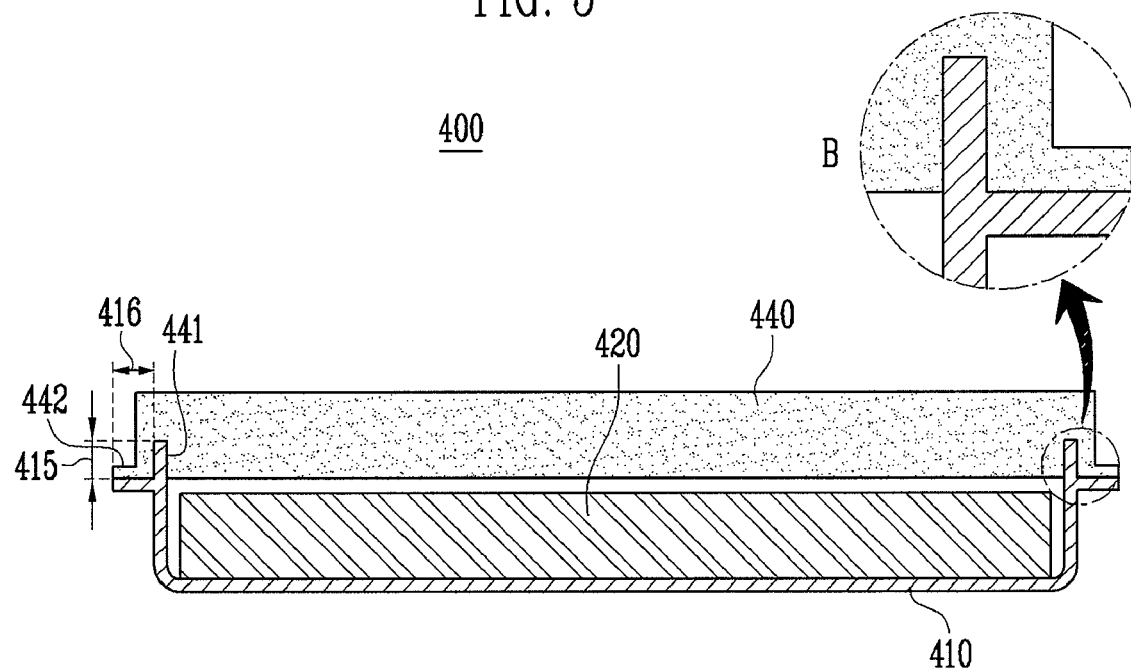
FIG. 5 is a cross-sectional view of an organic light emitting display device according to another embodiment.

FIG. 5 is a cross-sectional view of an organic light emitting display device according to another embodiment. Referring to FIG. 5, an organic light emitting display device 400 includes a display panel 420 having a first substrate on which an organic light emitting element is formed, a second substrate disposed over the first substrate, and a seal for bonding the first substrate and the second substrate; and a bezel 410 including a lower surface and a plurality of side walls extending from edges of the lower surface, and allowing the display panel 420 to be received in a space defined by the lower surface and the side walls. In addition, the display device 400 includes a protective window 440 provided on the top of the bezel 410, and first and second ribs 415 and 416 extending from the side wall of the bezel 410. The first ribs 415 are coupled to a groove 441 formed on the inner side of the protective window 440.

The display panel 420 includes a first substrate on which an organic light emitting element is formed, a second substrate disposed over the first substrate, and a seal sealing the first substrate and the second substrate.

The bezel 410 reinforces the strength of the display panel 420. The bezel 410 comprises the lower surface, the plurality of side walls extending from edges of the lower surface, and the first rib 415 and the second rib 416 extending from the plurality of the side walls.

The receiving space of the display panel 420 is formed by the lower surface and the side walls of the bezel 410, with the substrate of the display panel 420 corresponding to the lower surface of the bezel 410, and the side walls of the bezel 410 correspond to the sides of the display panel 420.

In the illustrated embodiment, the side walls of the bezel 410 extend in an orthogonal direction from the lower surface of the bezel 410 and correspond to the sides of the display panel 420. In addition, each first rib 415 extends in a direction parallel to the adjacent side wall of the plurality of the side walls, and each second rib 416 is formed in a predetermined region between a first rib 415 and a side wall, extending in a direction orthogonal to the adjacent side wall, and in an direction opposite to the receiving space of the bezel 410 in which the display panel 420 is received.

In order to bond the protective window 440 protecting the display panel 420 to the bezel 410, the first rib 415 is inserted into the groove 441 formed on the inner side of the protective window 440, thereby coupling the bezel 410 and the protective window 440 as shown in inset B of FIG. 5.

That is, the first rib 415 is coupled to the groove 441 formed on the inner side of the protective window 440 and the second rib 416 supports a projecting part 442 extending from the sides of the protective window 440, thereby bonding the bezel 410 and the protective window 440.

In addition, in order to improve the bond strength between the bezel 410 and the protective window 440, adhesive members (not shown) can be formed on the surfaces of the first rib 415 and the second rib 416 that contact the groove 441.

As such, the first rib 415 and the second rib 416 formed on the bezel 410 further increase the surface area of the bezel 410 bonded to the protective window 440, thereby further improving the bond strength between the bezel 410 and the protective window 440. Also, in the present embodiment, the second rib 416, thereby makes the degree of bonding between the protective window 440 and the first rib 415 more uniform.

Figure 6:
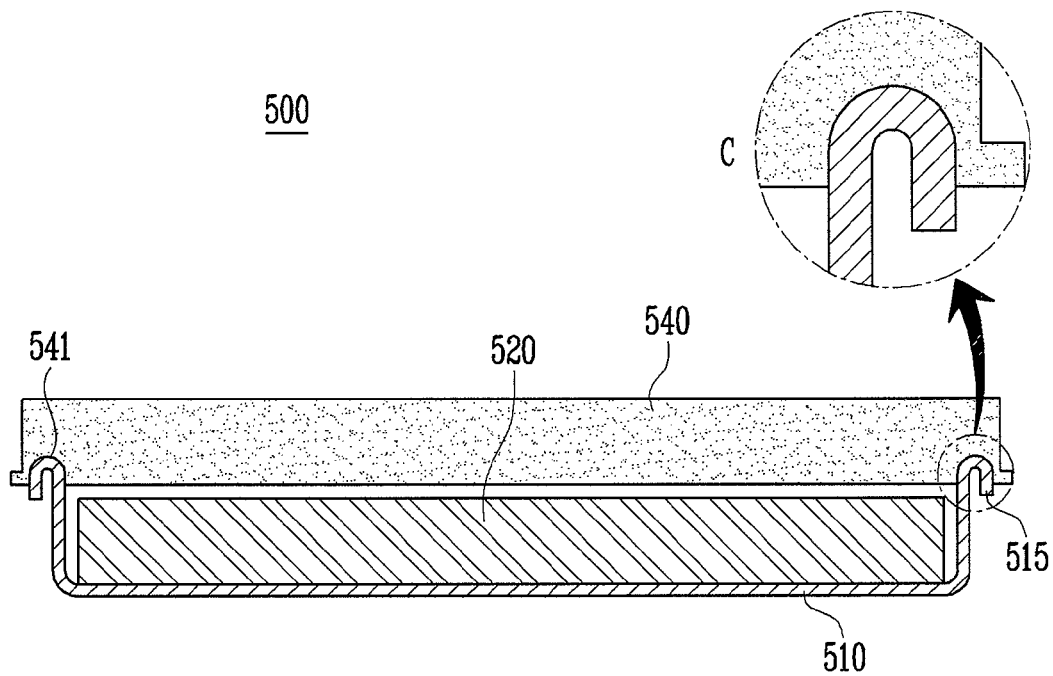
FIG. 6 is a cross-sectional view of an organic light emitting display device according to a another embodiment.

FIG. 6 is a cross-sectional view of an organic light emitting display device according to a another embodiment. Referring to FIG. 6, an organic light emitting display device 500 includes a display panel 520 having a first substrate on which an organic light emitting element is formed, a second substrate disposed over the first substrate, and a seal for bonding the first substrate and the second substrate; a bezel 510 including a lower surface and a plurality of side walls extending from edges of the lower surface, and allowing the display panel 520 to be received in a space defined thereby. In addition, the display device 500 includes a protective window 540 provided on the top of the bezel 510, and a first rib 515 extending from the side wall of the bezel 510 and coupled to a groove 541 formed on the inner side of the protective window 540.

The display panel 520 includes a first substrate on which an organic light emitting element is formed, a second substrate disposed over the first substrate, and a seal sealing the first substrate and the second substrate.

The bezel 510 reinforces the strength of the display panel 520. The bezel 510 comprises the lower surface, the plurality of side walls extending from edges of the lower surface, and the first rib comprising a folded edge or fold-over 515 extending from at least one of the plurality of the side walls.

The receiving space of the display panel 520 is formed by the lower surface and the side walls of the bezel 510, with the substrate of the display panel 520 corresponding to the lower surface of the bezel 510, and the side walls corresponding to the sides of the display panel 520.

In the illustrated embodiment, the side walls of the bezel 510 and adjacent the fold-ever 515 extend in an orthogonal direction from the lower surface of the bezel 510 and corresponded to the sides of the display panel 520. The fold-over 515, is formed by bending the first rib formed on each side wall in a direction opposite from the receiving space of the bezel 510 in which the display panel 520 is received.

In order to bond the protective window 540 protecting the display panel 520 to the bezel 510, each fold-over 515 is inserted into the groove 541 formed on the inner side of the protective window 540, thereby coupling the bezel 510 and the protective window 540, as shown in inset C of FIG. 6.

In order to improve the bond strength between the bezel 510 and the protective window 540, adhesive members (not shown) can be formed on the surfaces of the fold-over 515 that contact the groove 541.

In the illustrated embodiment, the fold-over 515 of the bezel 510 is rounded, thereby improving the rigidity of the bezel 510 and the organic light emitting display device 500, and also increasing the surface area of the bezel 510 bonded to the protective window 540, thereby improving the bond strength between the bezel 510 and the protective window 540.

FIGS. 7a to 7e are cross-sectional views showing detail views of embodiments of a bezel having a first rib with a fold-ever structure. In the illustrated embodiments, a side wall of the bezel is bent or folded into a double-wall structure, thereby forming an auxiliary side wall.

Figure 7A:
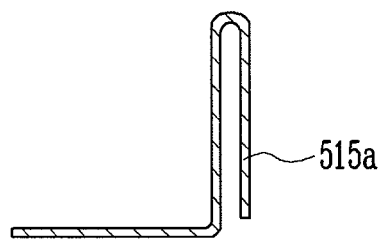
FIGS. 7A to 7E are cross-sectional views showing of embodiments of a bezel having a fold-over structure.

Referring to FIG. 7a, a portion of the side wall 515a of the bezel is bent outwardly, away from the receiving space for the display panel, and extends to about the lower surface of the bezel, forming a space between the side wall and the auxiliary side wall. In the illustrated embodiment, the side wall and auxiliary side wall have about equal heights.

Figure 7B:
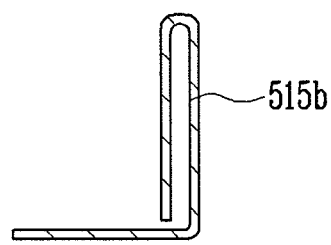

Referring to FIG. 7b, a portion of the side wall 515b of the bezel is bent inwardly, towards the receiving space for the display panel, and extends to about the lower surface of the bezel, forming a space between the side wall and the auxiliary side wall. In the illustrated embodiment, the side wall and auxiliary side wall have about equal heights.

Figure 7C:
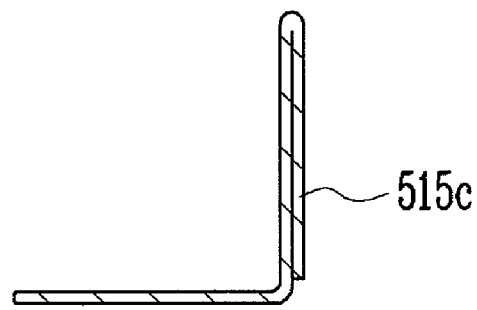

Referring to FIG. 7c, a portion of the side wall 515c of the bezel is bent outwardly, away from the receiving space for the display panel, and extends to about the lower surface of the bezel, with substantially no space between the side wall and the auxiliary side wall. In the illustrated embodiment, the side wall and auxiliary side wall have about equal heights.

Figure 7D:
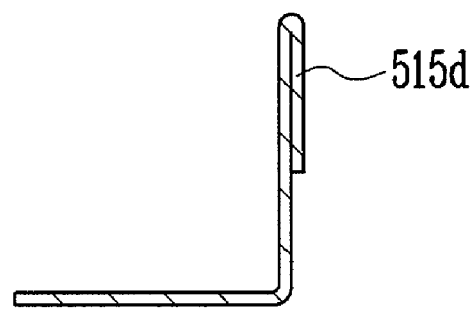

Referring to FIG. 7d, a portion of the side wall 515d of the bezel is bent outwardly, away from the receiving space for the display panel, and extends partway to the lower surface of the bezel, with substantially no space between the side wall and the auxiliary side wall. In the illustrated embodiment, the side wall and auxiliary side wall do not have equal heights.

Figure 7E:
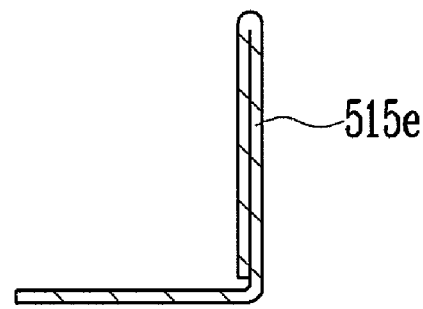

Referring to FIG. 7e, a portion of the side wall 515e of the bezel is bent inwardly, towards the receiving space for the display panel, and extends to about the lower surface of the bezel, with substantially no space between the side wall and the auxiliary side wall. In the illustrated embodiment, the side wall and auxiliary side wall have about equal heights.

As described above, first rib is formed on a bezel is coupled with a groove, corresponding to the first rib, formed on a protective window, thereby improving bonding and adhesion between the bezel and the protective window. In addition, the first rib formed on the bezel is coupled to the groove formed on the inner side of the protective window makes possible connecting the bezel and the protective window without forming the adhesive member therebetween. Accordingly, it is possible to design a rigid organic light emitting display device.

Although certain embodiments have been shown and described, it would be appreciated by those skilled in the art that changes might be made without departing from the principles and spirit of the disclosure, the scope of which is defined by the claims and their equivalents.

What is claimed is:

1. An organic light emitting display device comprising:
an organic light emitting display panel;
a bezel comprising a lower surface and a plurality of side walls extending from edges of the lower surface, the lower surface and the side walls forming a receiving space in which the display panel is received;
a first rib formed on at least one side wall, the rib having two opposed sides;
a protective window disposed on the top of the bezel; and
a groove formed on the protective window, wherein the groove comprised an opening that is enclosed on two opposed sides;
wherein the first rib is coupled with the groove so that the groove engages the ribs such that both of the opposed sides are positioned proximate the opposed sides of the groove.

2. The organic light emitting display device as claimed in claim 1, wherein the first rib comprises a fold-over portion.

3. The organic light emitting display device as claimed in claim 2, wherein the fold-over of the first rib is formed by bending a portion of a side wall.

4. The organic light emitting display device as claimed in claim 3, wherein the fold-over forms an auxiliary side wall.

5. The organic light emitting display device as claimed in claim 4, wherein substantially no space exists between the sidewall and the auxiliary side wall.

6. The organic light emitting display device as claimed in claim 4, wherein the auxiliary sidewall extends to about the lower surface of the bezel.

7. The organic light emitting display device as claimed in claim 2, wherein the fold-over is folded outwardly relative to the receiving space.

8. The organic light emitting display device as claimed in claim 2, wherein the fold-over is folded inwardly relative to the receiving space.

9. The organic light emitting display device as claimed in claim 2, wherein the fold-over comprises a rounded profile.

10. The organic light emitting display device as claimed in claim 1, wherein the bezel further comprises at least one a second rib disposed between the side wall and the first rib of the bezel and substantially orthogonal thereto.

11. The organic light emitting display device as claimed in claim 10, wherein the second rib is adhered to a projecting part extending from the protective window.

12. The organic light emitting display device as claimed in claim 1, wherein the groove is formed on an inner side of the protective window in a position corresponding to the first rib.

13. The organic light emitting display device as claimed in claim 1, wherein the bezel comprises three side walls, corresponding to three sides of the display panel.

14. The organic light emitting display device as claimed in claim 13, wherein each sidewall comprises a first rib.

15. The organic light emitting display device as claimed in claim 1, wherein an adhesive member is disposed between the bezel and the protective window.

16. The organic light emitting display device as claimed in claim 15, wherein at least a portion of the adhesive member is disposed in a contact surface between the first rib and the groove.

17. The organic light emitting display device as claimed in claim 15, wherein the adhesive member comprises at least one of an adhesive and a vinyl tape.

18. The organic light emitting display device as claimed in claim 1, wherein a polarizing plate is disposed between the display panel and the protective window.

19. The organic light emitting display device as claimed in claim 1, wherein the bezel comprises at least one of stainless steel (STS), magnesium, magnesium alloy, and aluminum.

* * * * *